(12) United States Patent
Speckner

(10) Patent No.: US 7,038,451 B2
(45) Date of Patent: May 2, 2006

(54) METHOD, PHANTOM STRIPE STRUCTURE AND DEVICE FOR DETERMINING THE MODULATION TRANSFER FUNCTION (MTF) OF A MEDICAL MR SYSTEM

(75) Inventor: Thorsten Speckner, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/013,758

(22) Filed: Dec. 16, 2004

(65) Prior Publication Data

US 2005/0134264 A1 Jun. 23, 2005

(30) Foreign Application Priority Data

Dec. 18, 2003 (DE) .................................. 10359976

(51) Int. Cl.
*G01V 3/00* (2006.01)
(52) U.S. Cl. ...................................... 324/308; 324/307
(58) Field of Classification Search ................ 324/319, 324/322, 318, 309, 308, 307, 300; 600/407
See application file for complete search history.

(56) References Cited

U.S. PATENT DOCUMENTS

| | | | | |
|---|---|---|---|---|
| 4,888,555 A | * | 12/1989 | Vaughan et al. ............ | 324/318 |
| 5,164,978 A | * | 11/1992 | Goodenough et al. ...... | 378/207 |
| 5,165,050 A | | 11/1992 | Goodenough et al. | |
| 5,803,082 A | * | 9/1998 | Stapleton et al. ........... | 600/407 |
| 6,720,766 B1 | * | 4/2004 | Parker et al. ............... | 324/308 |
| 2003/0122544 A1 | | 7/2003 | Parker et al. | |
| 2003/0161520 A1 | | 8/2003 | Yamano et al. | |

OTHER PUBLICATIONS

International Electrotechnical Commission, "Medical Electrical Equipment—Magnetic resonance equipment for diagnostic imaging—Part 1: Determination of characteristics", May 12, 2003, 41 pages.

Michael C. Steckner, Dick J. Drost, and Frank S. Prato, "Computing the modulation transfer function of a magnetic resonance imager", Medical Physics vol. 21, No. 3, Mar. 1994, pp. 483-489.

Claudia Fellner, Walter Müller, Jens Georgi, Ulrike Taubenreuther, Franz A. Fellner, Willi A. Kalender; "A High-Resolution Phantom for MRI"; Magnetic Resonance Imaging; 2001; pp. 899-904; Elsevier Science Inc.

Shiaofen Fang, Tom Biddlecome, Mihran Tuceryan; "Image-Based Transfer Function Design for Data Exploration in Volume Visualization"; Proc. IEEE Visualization; 1998; pp. 1-8.

C.E. Metz, K.A. Strubler, and K. Rossmann; "Choice of Line Spread Function Sampling Distance for Computing the MTF of Radiographic Screen-Film Systems"; Phys. Med. Biol.; Mar. 22, 1972; pp. 638-647.

* cited by examiner

*Primary Examiner*—Brij B. Shrivasta

(57) ABSTRACT

A method for determining the modulation transfer function (MTF) of a magnetic resonance system is described. The method involves recording, by means of the relevant magnetic resonance system, a cross-sectional image of stripe structure (S, $S_1$, $S_2$, $S_3$, $S_4$, $S_5$, $S_6$) of a phantom (1) with a number of alternately arranged magnetic resonance device-active material layers (6) and magnetic resonance device-inactive material layers (7) with a prespecified periodicity running at right angles to the cross-sectional recording plane (BE), with the magnetic resonance device-active material layers (6) being thicker than the magnetic resonance device-inactive material layers (7). Subsequently the quotient of the standard deviation (ó) and of the mean (<lb(x)l>) of the intensity values of the pixels located in a specific Region of Interest (ROI) are determined and defined on the basis of the quotient of the modulation transfer function determined. In addition a corresponding phantom stripe structure and a device for determining the modulation transfer function are described.

12 Claims, 4 Drawing Sheets

FIG 1 Stand der Technik
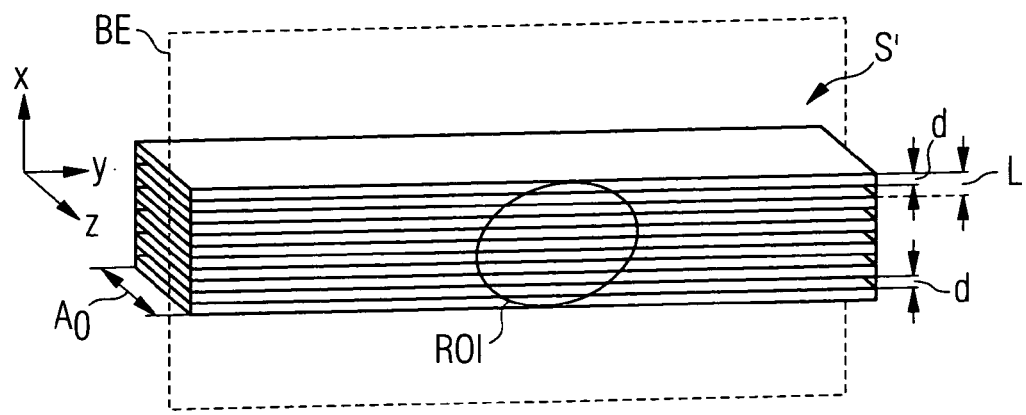
FIG 2 Stand der Technik
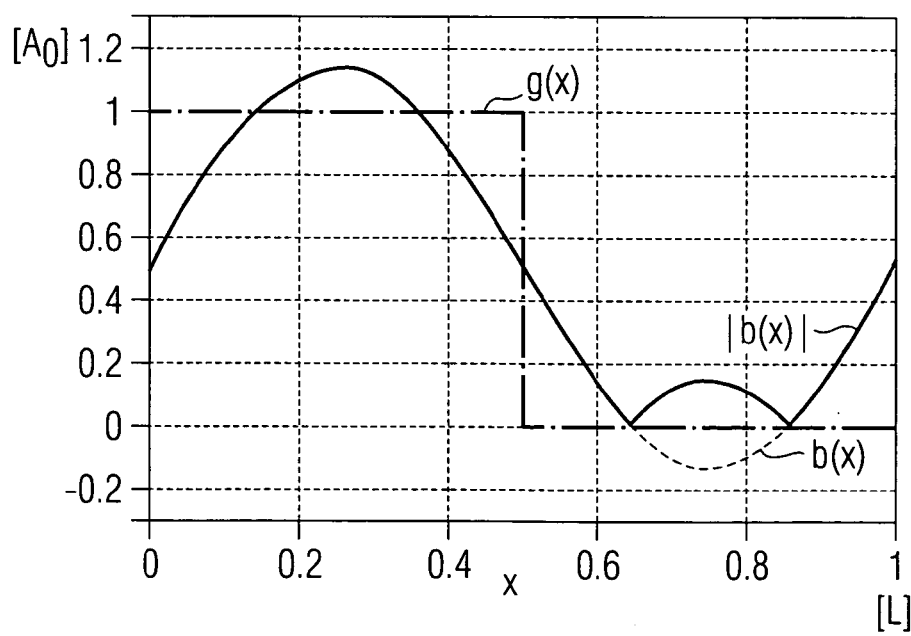

FIG 3 Stand der Technik
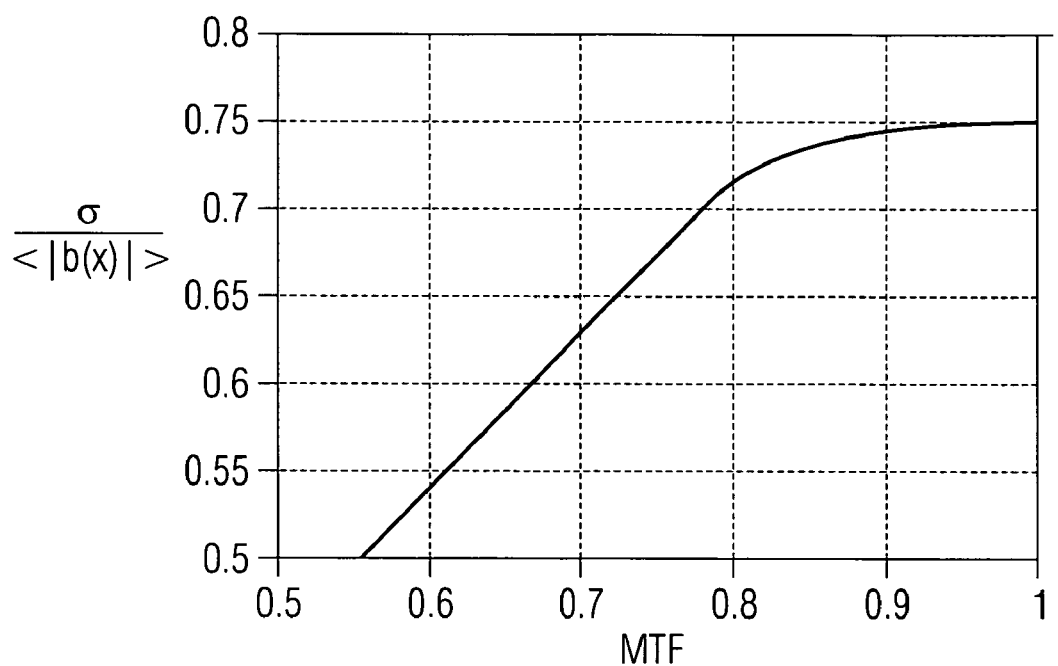
FIG 4
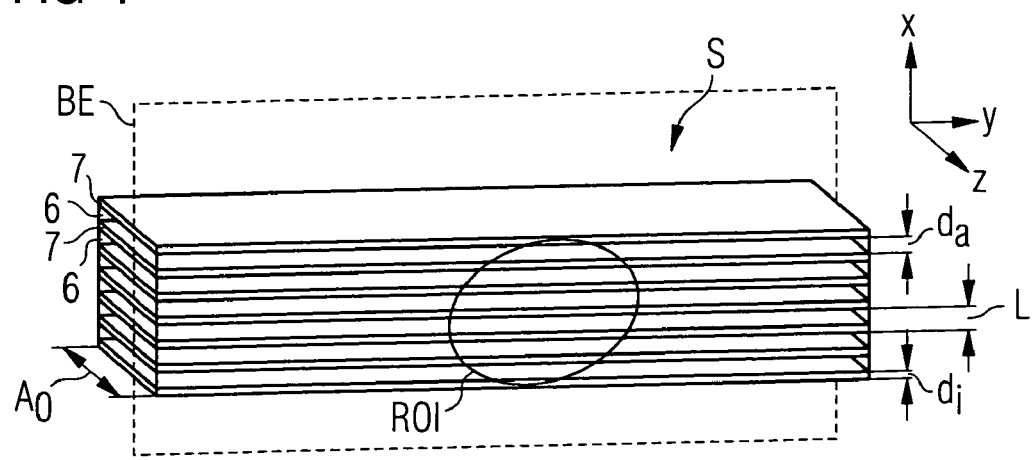

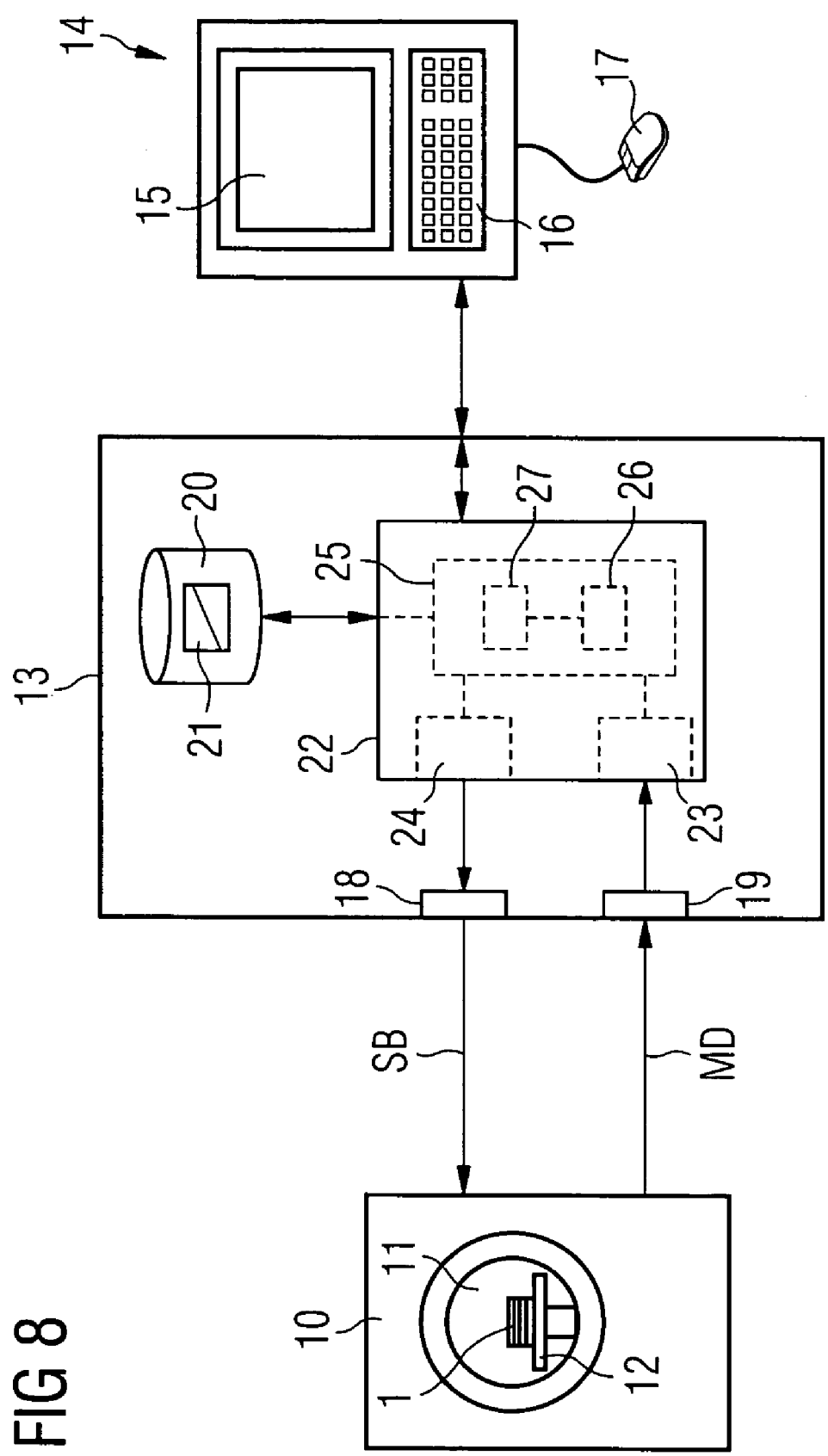

METHOD, PHANTOM STRIPE STRUCTURE AND DEVICE FOR DETERMINING THE MODULATION TRANSFER FUNCTION (MTF) OF A MEDICAL MR SYSTEM

CROSS REFERENCE TO RELATED APPLICATIONS

This application claims priority to the German application No. 10359976.2, filed Dec. 18, 2003 which is incorporated by reference herein in its entirety.

FIELD OF INVENTION

The invention relates to a method for determining the modulation transfer function of a magnetic resonance system, in which the magnetic resonance system concerned is initially used to record a cross-sectional image of a stripe structure of a phantom running at right angles to the cross-sectional image recording plane (also referred to below as the "phantom stripe structure") with a number of alternately arranged magnetic resonance-active layers and magnetic resonance-inactive material layers with a specified periodicity and then the quotient of a standard deviation and of the mean of the intensity values of the pixels located in a specific Region of Interest of this cross-sectional image are determined and the modulation transfer function is defined on the basis of the quotient determined. The invention further relates to a phantom stripe structure for determining the modulation transfer function of a magnetic resonance system with a number of alternately arranged magnetic resonance device-active material layers and magnetic resonance device-inactive material layers with a prespecified stripe structure as well as to a phantom with such a phantom stripe structure, In addition the invention relates to a device for automatically determining the modulation transfer function of a magnetic resonance system in accordance with said method and a magnetic resonance system with such a device.

BACKGROUND OF INVENTION

As with any other imaging system both the makers and the users of a magnetic resonance systems are interested in establishing, as simply and accurately as possible, the image quality that can be obtained with such a system. Two especially important image quality characteristics, namely the "local resolution" or "high-contrast resolution" can be derived from what is known as the modulation transfer function" or "MTF" for short). The modulation transfer function here is a quantitative variable depending on the local frequency to be mapped for describing the local resolution of an imaging system. With X-ray systems the MTF is a function which reduces monotonously as the local frequency increases and finally, at the limit frequency, falls below a specific threshold value (e.g. 50%). With magnetic resonance systems on the other hand the MTF is as a rule a constant which suddenly falls to zero at what is known as the Nyquist frequency $f_c$ which corresponds to the minimum value of the local resolution. The local resolution—and thereby the Nyquist frequency—can usually be set on the magnetic resonance system (MR system) and is primarily a function of the gradient strength setting. Use of specific filters further allows the modulation transfer function of the MR system to be influenced however. For example the Hanning filter can be used to filter out high local frequencies. Using these types of filter the MTF of the MR system, especially close to the Nyquist frequencies $f_c$, is blurred.

SUMMARY OF INVENTION

One problem that remains however is that of determining as simply and uniquely as possible the modulation transfer function of MRT devices. In the article entitled "Computing the modulation transfer function of a magnetic resonance imager" by Michael C. Steckner, Dick J. Drost and Frank S. Prato in Med. Phys. 21 (3), 1994, it is proposed that the modulation transfer function be calculated with the aid of the Fourier transformed so called "line spread function". The line spread function here is the image of a infinitesimally narrow line. Since the worse the resolution of the system is, the wider this line spread function is, this line spread function corresponds to the "pulse response" of the system. Since in practice infinitesimally narrow lines cannot be created it is proposed that the line spread function be determined as a derivation of an edge image function, i.e. of the image of a step in the object. In the reconstruction of MR layer images however a complex image signal consisting of a real part and an imaginary part is generated from the measured magnetic resonance raw data. To determine the MTF with the aid of the edge image function of a recorded step in the object a differentiation of this complex image data is consequently necessary. On the other hand the magnitudes of the complex image data are frequently only shown as intensity values in the layer image, i.e. only the magnitude of the imaging function at the relevant location is considered. Existing magnetic resonance devices as are normally employed by users thus frequently only deliver the magnitude images required. The users themselves cannot access the original complex image data. A method for determining the modulation transfer function from the edge image function would thus demand considerable expansions in the existing magnetic resonance system or the applications available on it.

In a current draft for the new IEC-Norm 62312-1 the technically simpler method mentioned at the start for determining the modulation transfer function is thus proposed. With this method the modulation transfer function can be determined for particular points, i.e. for individual local frequencies. In this case a cross-sectional image of a phantom with an equidistant stripe structure (also called a stripe pattern) is prepared. A schematic of a such an equidistant phantom stripe structure S' is depicted in FIG. 1. As can be clearly seen, the stripe structure consists of a number of magnetic resonance device-active material layers and magnetic resonance device-inactive material layers arranged alternately one above the other or alongside each other. The magnetic resonance device inactive material layers can for example be Plexiglas or similar materials, the magnetic resonance device-active material layers are as a rule water or something similar. Since an equidistant stripe structure is involved, the layer thickness of the magnetic resonance device-active material and the layer thicknesses of the magnetic resonance device inactive material are identical. The periodicity L of the stripe structure thus corresponds to the double stripe thickness d of the magnetic resonance device-inactive material layers or the magnetic resonance device-active material layers. The modulation transfer function at a local frequency i which is determined by the transit ion value of the periodicity L of the stripe structure can then be determined from a cross section of this stripe structure. In this case the cross sectional recording plane is selected so that it runs at right angles—as a rule vertical—to the way that the stripe pattern runs, i.e. in the example shown in FIG. 1, the cross section runs in the x/y plane or in a plane parallel to it. Such a one-dimensional equidistant stripe pattern with the frequency í=1/L can be developed into a Fourier series:

$$g(x) = A_0 \left( \frac{1}{2} + \frac{2}{\pi} \sum_{n=1,3,5,\ldots} \frac{1}{n} \sin(2\pi n x / L) \right) \quad (1)$$

Here x is the direction at right angles to the individual layers of the stripe structure and g(x) is what is known as the object function which describes the grid specified by the stripe structure in the object space. $A_0$ is the depth of the stripe structure or of the recorded section of the stripe structure i.e. $A_0$ corresponds for example to the recorded layer thickness.

If by approximation it is assumed that for the magnetic resonance system in the area under observation a linear, translation-invariant imaging system is involved, this system can be completely described in the frequency range by the modulation transfer function MTF(í) sought:

$$g(v) \xrightarrow{MTF(v)} b(v) \quad (2)$$

For the image function b(x) in the local area—which in the end involves imaging the stripe structure—the following equation is produced:

$$b(x) = A_0 \left( \frac{1}{2} + \frac{2}{\pi} \sum_{n=1,3,5,\ldots} \frac{1}{n} MTF(n/L) \cdot \sin(2\pi n x / L) \right) \quad (3)$$

For stripe structures of which the periodicity L is selected so that the local frequency í=1/L lies just below the maximum Nyquist frequency $í_c$ of the discretely scanning imaging system that can be resolved, it is in principle sufficient in the Fourier series development in accordance with equation (3) to take account of the basic oscillation n=1 since for the first harmonic with n=3 the modulation transfer function MTF(3/L)=MTF(3í>$í_c$) can be set approximately to zero. Since as a result all harmonics do not deliver any contribution, the image function according to equation (3) can also be approximated by the basic oscillation. This means that the following applies $$b(x) \approx A_0 \left( \frac{1}{2} + \frac{2}{\pi} MTF(v) \cdot \sin(2\pi x / L) \right) \quad (4)$$

for mean <b(x)> or the standard deviation ó the equations are then $$\langle b \rangle = \frac{1}{L} \int_0^L b(x) dx = \frac{1}{2} A_0 \quad (5)$$

$$\sigma = \left( \frac{1}{L} \int_0^L (b(x) - \langle b \rangle)^2 dx \right)^{1/2} = \frac{2}{\pi} A_0 MTF(v) \quad (6)$$

The following then applies in its turn for the quotients from standard deviation ó and average value <b>

$$\frac{\sigma}{\langle b \rangle} = \frac{2\sqrt{2}}{\pi} MTF(v) \quad (7)$$

This shows that is basically sufficient to position a specific image region, usually called the "Region of Interest" (ROI) above the stripe structure to be recorded in the cross-sectional recording plane and to determine the mean and the standard deviation of all intensity values of the pixels located in this Region of Interest, in order to then determine from the quotients of the mean and the standard deviation according to equation (7) the MTF for local frequency í given by the periodicity L of the phantom stripe structure.

One problem however is that—as already mentioned at the start—by contrast with x-ray computer tomography, with magnetic resonance imaging magnitude images of mostly |b(x)| are observed. I.e. the following applies in this case:

$$\langle b \rangle = \frac{1}{L} \int_0^L |b(x)| dx \quad (8)$$

$$\sigma = \left( \frac{1}{L} \int_0^L (|b(x)| - \langle b \rangle)^2 dx \right)^{1/2} \quad (9)$$

The above relationship in accordance with equation (7) is consequently no longer generally applicable. This is clearly shown in the diagram in FIG. 2, in which the image function b(x) is entered above the location x. The location x is entered here in units of the periodicity L, the image function is standardized to the layer thickness $A_0$, i.e. the function value 1 corresponds to the layer thickness $A_0$. Also entered, in the form of a dotted line, is the original object function g(x) given by the stripe structure, which up to the point x=0.5 L has the value 1 (=$A_0$) and in the remaining range between x=0.5 L and x=L has the value 0. The associated image function b(x) has a sine wave structure as would be expected. Here the assumption is made that the MTF of the imaging system is approximately equal to 1. As can clearly be seen, the image function b(x) falls below the zero point at its minimum Actually only the magnitude of the image function |b(x)| which corresponds to the drawn curve is determined as the intensity. This accordingly also falsifies the mean. Whereas the mean <b(x)> of the image function is 0.5, the mean <|b(x)|> of the magnitude of the image function is 0.54 (for MTF(í=1/L)=1).

For this reason the quotient of the standard deviation and the mean is a non-linear function (referred to below as "assignment function") of the modulation transfer function. Especially with high values of the modulation transfer function as are usually provided and also desired by the user or manufacturer, the assignment function is also not unique. In FIG. 3 the assignment function, i.e. the quotient ó/<b(x)> as a function of the modulation transfer function MTF is shown for an equidistant stripe structure. This curve clearly shows that above an MTF of 0.9 it is no longer possible to accurately precisely determine the exact value to some extent.

It is thus an object of the present invention to improve the method mentioned at the start and to create the corresponding means to execute the improved method so that the modulation transfer function can be determined simply and uniquely, even with high modulation transfer function values.

This object is achieved by the claims.

In accordance with the invention, the method now proposed—unlike what was previously provided—uses a phantom stripe structure of which the magnetic resonance device—active material layers are thicker than the magnetic resonance device inactive material layers. As well be explained in more detail further on, suitable choice of the layer thicknesses of the magnetic resonance device-active materials and of the magnetic resonance device-inactive material in relation to one another enables the assignment function which specifies the dependence of the desired modulation transfer function on measured quotient of the mean and of the standard deviation to be unique over the entire range of the modulation transfer function and if nec. even linear.

Preferably a phantom stripe structure is used here which features a fill factor equal to or greater than 0.517. The fill factor is defined here by the ratio of the thickness of the magnetic resonance device active material layer to the periodicity. It has transpired that the curve has a unique shape as from a fill factor of 0,517 onwards.

Since however for fill factors just above this value the shape of the assignment function for very high values of the modulation transfer function near 1 is very flat, a phantom stripe structure is preferably selected which features a fill factor greater than appr. 0.565.

Especially preferred is the use of a phantom stripe structure which features a fill factor equal to or greater than 0.603. Above this fill factor a linearity of the assignment function is produced which greatly simplifies the calculation of the MTF from the measured quotients of the average value and standard deviation.

As already explained at the start of this document, with this method the modulation transfer function is determined for a specific local frequency which corresponds to the periodicity of the phantom stripe structure used. The obvious solution for determining the modulation transfer function as a function of the local frequency is thus to create a number of cross-sectional images, with phantom stripe structures with different periodicities being recorded for the different cross-sectional images. Preferably phantom stripe structures are used here which although they have different periodicities, still feature the same fill factor, so that the same assignment function for determining the modulation transfer function can be used. With the aid of the different cross-sectional images of different phantom stripe structures the modulation transfer function at a corresponding number of support points is then obtained. Using normal methods of adaptation an assignment function or assignment curve can then be adapted at these support points to obtain the modulation transfer function over a second frequency range. Likewise it is possible to use normal interpolation methods to supplement the modulation transfer function between the measured support points.

Preferably for a specific local resolution set on the magnetic resonance system a phantom stripe structure with a periodicity is selected such that the local frequency (corresponding to the transition value of the periodicity L í lies in a range above the half of the Nyquist frequency z í$_c$ below the Nyquist frequency í$_c$. The Nyquist frequency í$_c$ is determined in this case by the local resolution set. In this frequency range the modulation transfer function is very easy to determine with the method according to the invention.

Since the MRT devices usually employed at present offer the option of defining any given Region Of Interest (ROI) and undertaking statistical evaluations of all the image pixels contained within it, these operations including in particular the computation of the mean and the standard deviation of the magnitude intensities, the method in accordance with the invention is advantageously also able to be executed manually with existing terminals. All that is required here is for the user to use an inventive phantom stripe structure with a specific fill factor >0.5 and a prespecified periodicity L. The user can then record a layer image through this phantom stripe structure, determine the mean and the standard deviation within the ROI and for example work out the quotient with a calculator. The user then also needs some form of the assignment function for a relevant fill factor of the phantom stripe structure used, be it for example in the form of a table, a conversion formula or in graphical form. With the aid of this assignment function he can then determine from the computed quotient the modulation transfer function for the local frequency produced by the periodicity of the phantom stripe structure used.

To determine the modulation transfer function at a number of local frequency points the user can calibrate a number of phantoms with different phantom stripe structures in turn. To do this the user can for example be provided with set with corresponding phantoms. Preferably however a phantom is used featuring a number of phantom stripe structures with different periodicities, where the different phantom stripe structures especially preferably feature the same fill factors. Likewise a set of phantoms can also be used with one or more phantoms featuring a number of phantom layer structures allowing the MTF to be calibrated as simply as possible at a large number of support points, for example two phantoms each with six different phantom layer structures to calibrate the MTF at twelve support points etc.

The obvious choice is thus especially, with a corresponding arrangement of the phantom stripe structures, to make a recording which includes a number of the different phantom stripe structures. Subsequently the Region of Interest within which the mean of the standard deviation are measured can simply be displaced in the evaluation such that a specific phantom stripe structure with a specific periodicity is recorded in each case.

Furthermore it is also possible to execute the determination of the modulation transfer function with a corresponding inventive device automatically. Such a device must on the one hand feature an image evaluation unit to determine the mean and the standard deviation of the intensity values of the pixels located in its prespecified Region of Interest of a cross section taken by the magnetic resonance system concerned of a stripe structure running at right angles to a cross-sectional image of a phantom with a number of magnetic resonance-active material layers and magnetic resonance-inactive material layers with a prespecified periodicity arranged alternately, with the phantom stripe structure featuring in an area relevant to the cross-sectional recording a specific fill factor f>0.5. In addition this device needs an arithmetic unit for automatically computing the quotient of the mean and standard deviation. In accordance with the invention a memory device with at least one assignment function for a phantom stripe structure with the relevant fill factor, on the basis of which the modulation transfer can be determined in each case as a function of the quotient of the mean and the standard deviation, and an assignment unit are needed in order to determine, depending on the fill factor of the recorded phantom stripe structure, by means of the assignment function the modulation transfer function for a local frequency given by the periodicity.

Such a device can preferably be integrated directly into a magnetic resonance device or the control device belonging to the magnetic resonance device. The image evaluation unit, the arithmetic unit and the assignment unit can especially preferably be realized in the form of software in a processor of the device or the control device of the magnetic resonance device. In this case the image evaluation system used in any event in the magnetic resonance device and also used for other purposes can be used as the image evaluation unit. Likewise an existing memory device of the unit can also be used in order to store the required assignment function.

Above and beyond this it is also possible for a number of the assignment functions for different fill factors to be stored in the memory unit and for phantom stripe structures with different fill factors to be available to the user for example. It is then only necessary to ensure that the assignment unit is provided with the in formation about the fill factor of the phantom stripe structure used so that the latter can determine the modulation transfer function on the basis of the correct assignment function from the computed mean/standard deviation quotient.

An essentially software realization of the device has the advantage that it is a simple matter—e.g. through an update of the service software—to even enable existing magnetic resonance tomography devices or their controllers to be upgraded to perform the inventive method.

BRIEF DESCRIPTION OF THE DRAWINGS

The invention is explained in more detail below with reference to the enclosed Figures on the basis of an exemplary embodiment. The diagrams show:

FIG. 1 a schematic diagram of a phantom stripe structure according to the prior art with a fill factor of 0.5, FIG. 2 a diagram of a part of the local function g(x) and the associated image function b(x) of a structure according to FIG. 1, FIG. 3 a diagram of a conventional assignment function for a phantom stripe structure with a fill factor f=0,5 according to the prior art, which specifies the dependence of the standard deviation/mean quotient on the modulation transfer function, FIG. 4 a schematic diagram of an inventive phantom stripe structure, FIG. 5 a diagram of the various assignment functions which, for different fill factors of associated phantom stripe structures, specify the dependence of the modulation transfer function on the standard deviation/mean quotient FIG. 6 a schematic overhead view of a phantom with a number of inventive phantom stripe structures, FIG. 7 a cross section through the phantom in accordance with FIG. 6 along the line A–A', FIG. 8 a schematic diagram of an inventive magnetic resonance system with a device for automatically determining the modulation transfer function in accordance with the inventive method.

DETAILED DESCRIPTION OF INVENTION

Figure 5:
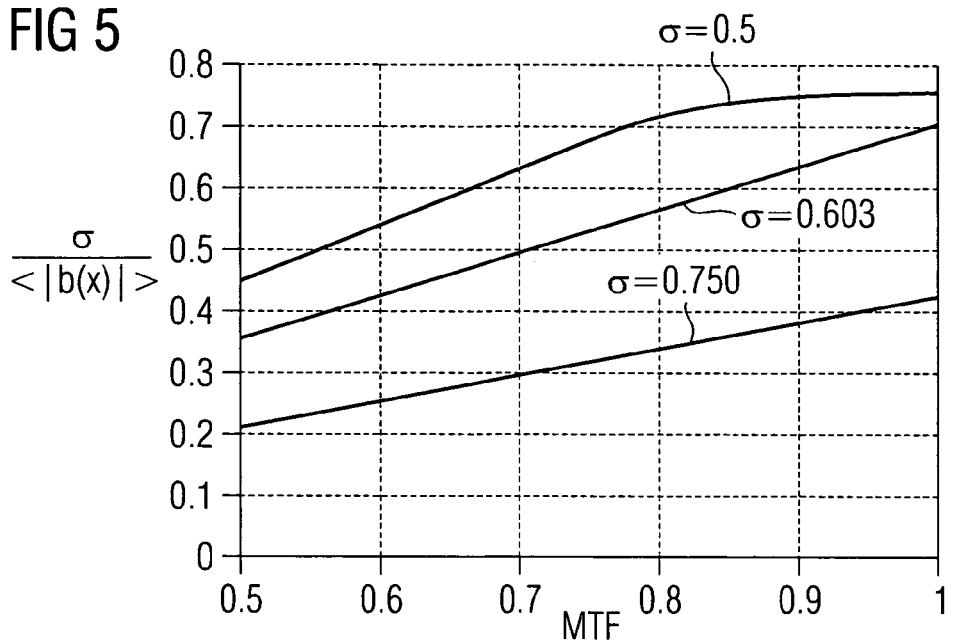

The known method of determining the modulation transfer function with the aid of a phantom stripe structure has already been explained on the basis of FIGS. 1–3 at the start of its document, featuring alternate layers with magnetic resonance-active material and magnetic resonance-inactive material with the same thickness.

With the method in accordance with the invention a phantom is now used with a phantom stripe structure of which the thickness $d_a$ of magnetic resonance device-active material layers 6 is greater than the thickness $d_I$ of the magnetic resonance device-inactive material layers 7. This means that the following applies for the fill factor $f=d_a/L>0.5$ (with $L=d_a+d_I$). FIG. 4 shows such a phantom stripe structure S in accordance with the invention.

In order to use this phantom stripe structure S to determine the modulation transfer function at the local frequency point í=1/L a cross section is created as in the known method along one of the cross section planes BE lying in a the x/y plane or in a plane parallel to, so that the individual layers 6, 7 run at right angles to the cross sectional plane BE. The width of the recorded layer is again assumed below to be $A_0$. The inventive change of the geometry of the phantom of stripe structure S—as shown below—enables a unique and linear relationship of the modulation transfer function to the measured quotient of standard deviation ó to the mean <|b(x)|> over the entire definition range of the modulation transfer function MTF(í) to be established.

If, as shown in FIG. 4, the thickness $d_a$ of the magnetic resonance device-active material deviates from the thickness $d_I=(L-d_a)$ of the magnetic resonance device-inactive material, the Fourier transformation of the local function is as follows $$g(x) = A_0\left(f + \frac{2}{\pi}\sum_{n=1,2,3\ldots}\frac{(-1)^n}{n}\sin(n\pi f)\cos(2n\pi x/L)\right) \quad (10)$$

Here f is the already defined fill factor $f=d_a/L$. It should be noted that in equation (10)—unlike in the corresponding equation (3) which applies to an equidistant phantom stripe structure—not only the odd harmonics n=1,3,5 . . . , but also the even harmonics n=2,4,6 . . . are recorded. The cause of the suppression of the even harmonics in the case of the equidistant stripe structure is the symmetry of the function to be developed. Projections of the function onto even harmonics disappear since the integral to be evaluated delivers equally large contributions in the positive and in the negative direction.

Despite this, for the range of local frequencies í, i.e. with selection of a phantom stripe structure with the periodicity L=1/í, in the range $$\frac{1}{2}v_c \leq v \leq v_c$$

the equation (10) can be reduced in any event to the first basic oscillation. The equation for the magnitude of the image function b(x) is then as follows:

$$|b(x)| \approx \left|A_0\left(f - \frac{2}{\pi}MTF(v)\sin(\pi f)\cos(2\pi x/L)\right)\right| \quad (11)$$

If, with the aid of this magnitude of the image function |b(x)| the mean <|b(x)|> in accordance with equation (8) and the standard deviation ó in accordance with equation (9) is calculated and these values are used in equation (7), it is seen that for a fill factor f above a specific fill factor $f_{min}$, the variable, i.e. standard deviation/mean quotient over the standardized definition area of the MTF is a linear and unique function of the MTF. The fill factor $f_{min}$, above which this assignment function becomes linear is produced by the condition that the term between magnitude lines on the right hand side in equation (11) may not assume any negative values. This means that the following condition must apply:

$$A_0 \left( f - \frac{2}{\pi} MTF(v) \sin(\pi f) \cos(2\pi x/L) \right) \overset{!}{>} 0 \qquad (12)$$

The condition must apply even to the extreme value when the modulation transfer function MTF(í)=1 and the cosine term also assumes the value 1, i.e. when x=m L for m=0, 1,2,3 . . . . If MTF(í)=1 and cos(2πíx/)=1 are set, then instead of the condition (12) the condition $$\left( f - \frac{2}{\pi} \sin(\pi f) \right) \overset{!}{>} 0 \qquad (13)$$

or for f>$f_{min}$:

$$\sin(\pi f_{min})/\pi f_{min} \overset{!}{=} \frac{1}{2} \qquad (14)$$

is obtained

This produces the value $f_{min}$=0.603. For f>$f_{min}$ for the quotients of the standard deviation ό and the mean value <|b(x)|> like equation (7) one then obtains:

$$\frac{\sigma}{\langle |b| \rangle} = \frac{\sqrt{2}}{f\pi} \sin(f\pi) \cdot MTF(v) \qquad (15)$$

FIG. 5 shows this relationship for values of the fill factor $f_{min}$=0.603 as well as for the fill factor f=0.75 in the comparison with the case already discussed above in the prior art of a periodic equidistant phantom stripe structure with f=0.5. This graphic clearly shows that it is possible, by means of a stripe phantom with a fill factor of f≧$f_{min}$≈0,603 to obtain a unique and simple determination of the value of the MTF at the frequency í=1/L. Variation of the periodicity L enables the MTF to be determined above the frequency range $$\frac{1}{2} v_c < (v = 1/L) \le v_c$$

given above. Outside this frequency range it is also possible to determine the modulation transfer function taking into account expanded error limits. In particular the first harmonic should be taken into consideration which is often negligible within the context of the measuring error however for frequencies which only deviate slightly from the limit values stated previously.

Figure 6:
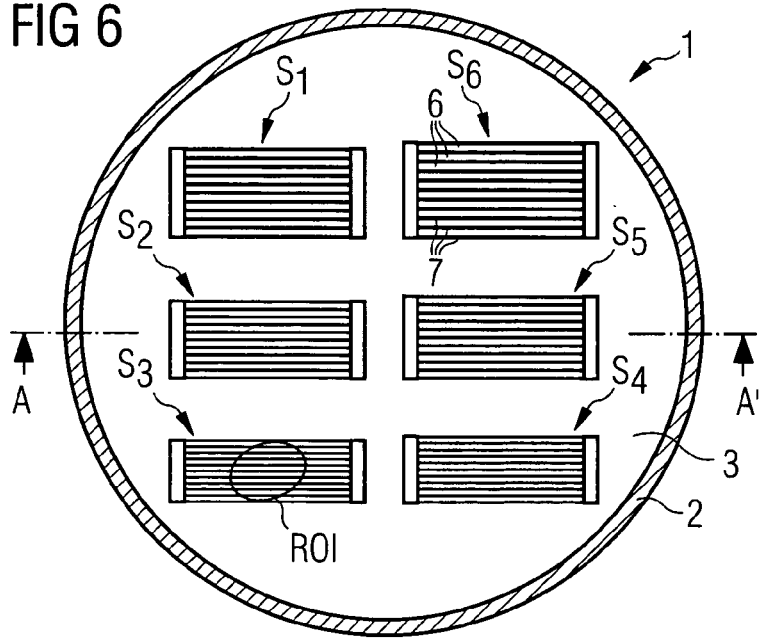
Figure 7:
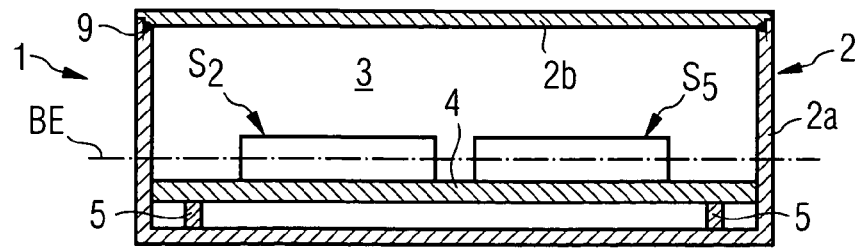

FIGS. 6 and 7 show an especially advantageously constructed phantom 1 with a number of different phantom stripe structure $S_1$, $S_2$, $S_3$, $S_4$, $S_5$, $S_6$, which has proven itself especially in practical application. This phantom 1 features a housing 2 of magnetic resonance device-inactive material, for example Plexiglas. The housing 2 is cylindrical in construction in the present exemplary embodiment but can however take any other form. It consists of a shell-shaped cylindrical lower part 2a and a close-fitting upper cover 2b sealed by means of an annular seal 9.

In the inside 3 of the housing 2 there is a carrier plate 4 set at a distance from the floor of the housing 2 which is supported on spacers 5. The carrier plate 4 and the spacers 5 are also made of MR-inactive material. The various phantom-stripe structures $S_1$, $S_2$, $S_3$, $S_4$, $S_5$, $S_6$ are supported on the carrier plate 4 and attached to it if necessary. These stripe structures $S_1$, $S_2$, $S_3$, $S_4$, $S_5$, $S_6$ each consist of a collection of a number of plates 7 made of magnetic resonance device-inactive material (preferably Plexiglas or similar), which are held on two opposite faces at a specified distance from each other by bars 8, also made of magnetic resonance device-inactive material. The stripe structures $S_1$, $S_2$, $S_3$, $S_4$, $S_5$, $S_6$ are arranged in this case on the carrier plate 4 so that the individual plates 7 made of magnetic resonance device-inactive material, as shown in FIGS. 6 and 7, stand vertically on the carrier plate 4.

The entire housing 2 is then filled with magnetic resonance device-active material. Water or especially preferred a phantom liquid is used for this purpose. The phantom liquid essentially consists of water, into which additives such as manganese fluoride or similar has been mixed in order to reduce the $T_1$ and $T_2$ relaxation time and thereby reduce the measurement time needed. The liquid magnetic resonance device-active material penetrates into all the spaces between the magnetic resonance device-inactive materials within the housing 2 and thus also the magnetic resonance device-inactive layer 7 of the phantom stripe structures $S_1$, $S_2$, $S_3$, $S_4$, $S_5$, $S_6$ formed by the Plexiglas plates. Consequently the water or phantom liquid cause the spaces between the two plates 7 of the layer 6 to be formed from magnetic resonance device-active material.

The individual phantom stripe structures $S_1$, $S_2$, $S_3$, $S_4$, $S_5$, $S_6$ each feature different periodicities L to enable different local frequencies í=1/L to be calibrated. The fill factor on the other hand is identical for all phantom stripe structures $S_1$, $S_2$, $S_3$, $S_4$, $S_5$, $S_6$ and preferably is above f=0.603.

With the aid of this phantom 1 the modulation transfer function can be determined at six support points in a simple way with just one measurement. To this end the phantom 1 is brought into the measuring area of a magnetic resonance device for example simple placed on the patient support table located there. A cross-sectional image through this phantom is then prepared, in which case the image plane BE, as shown in FIG. 7 runs in parallel above the floor of the housing 2 of the phantom 1 at a height which passes through the phantom stripe structures $S_1$, $S_2$, $S_3$, $S_4$, $S_5$, $S_6$.

Preferably the field of view is set here so that the rows and columns of the image matrix do not run in parallel to the stripes of the phantom stripe structures $S_1$, $S_2$, $S_3$, $S_4$, $S_5$, $S_6$. It is thus advantageous for the individual phantom-stripe structures $S_1$, $S_2$, $S_3$, $S_4$, $S_5$, $S_6$ to be arranged within the phantom 1 such that the stripes run in parallel to one another. This arrangement of the field of view transverse to the stripe direction of the phantom stripe structures $S_1$, $S_2$, $S_3$, $S_4$, $S_5$, $S_6$ has the advantage of always avoiding each pixel stripe of the field of view is magnetic resonance device-active material over precisely half its width and on the other half records magnetic resonance device-inactive material and thus accentuates the stripe structure in the image again and therefore cannot be resolved.

In the recorded layer image of this phantom 1 a region of interest ROI can then be shifted in each case on the individual phantom stripe structures $S_1$, $S_2$, $S_3$, $S_4$, $S_5$, $S_6$, as is shown in the example in FIG. 6 for the stripe structure $S_3$. The Region of Interest ROI should be selected here so that it lies completely within the stripe structure $S_1$, $S_2$, $S_3$, $S_4$, $S_5$, $S_6$ concerned but is still as large as possible in order to reduce the effect of image noise.

Subsequently mean and standard deviation can then be determined automatically for this ROI and the standard deviation/mean quotient determined from this. Finally the modulation transfer function can be correspondingly determined taking account of the selected fill factor on the basis of the assignment function the local frequency í=1/L.

FIG. 8 shows an exemplary embodiment of a magnetic resonance system with which such information can be determined fully automatically.

The diagram shows the actual magnetic resonance device 10 with a measurement chamber 11, a patient bed 12 located within said chamber and a schematic representation of a phantom 1 located on said bed. Preferably this phantom is the same as that depicted according to FIGS. 6 and 7.

Connected to this magnetic resonance device 10 is a control unit 13 via which the magnetic resonance device 10 is activated and by which the raw measurement data is accepted to enable the layer images to be reconstructed. Mostly this control unit 13 is directly integrated into the magnetic resonance device 10. However, as shown here in FIG. 8, it can also be arranged in a housing which is located in a separate operating room. A console 14 for operating the magnetic resonance device 10 is located on the control unit 13, said console usually consisting of a screen 15, a keyboard 16 and a pointer device 17, in this case a mouse or similar, to enable the images to be viewed for example and to plan measurements with the aid of a graphical user interface which is displayed here on the screen 15. In particular this can be used for example to position image planes for layer images to be recorded. This means that it can also be used to select the image plane for calibration of the phantom 1 and the positioning of the Region of Interest ROI.

The main parts of the control device 13 include a processor 22, a memory device 20 as well as interfaces 18 and 19, to transfer control commands SB to the magnetic resonance device 10 and correspondingly conduct the sequences of measurements for a specific layer image recording or series of layer image recordings as well as to accept the raw measurement data MD.

The control of the magnetic resonance device 10 for creating the cross-sectional image through the phantom-stripe structure $S_1$, $S_2$, $S_3$, $S_4$, $S_5$, $S_6$ is undertaken here by a control unit 24 of the processor 22 in accordance with values entered by the operator outputting the corresponding control commands SB via the control interface 18 to the magnetic resonance tomography device 10.

For measurement of a cross-sectional image through the phantom 1 for determining the MTF of the MRT device 10 the raw measurement data MD of the interface 19 is initially forwarded to an image evaluation unit 23 which reconstructs the desired cross-sectional images from the raw measurement data MD. The magnitude intensity values with a specific cross sectional image can for example be shown on the screen 15 of the console 4 for the user. The latter can then define a Region of Interest ROI which—as shown in FIG. 6—includes a specific stripe structure $S_3$ with a specific periodicity and a specific fill factor f.

The mean <|b(x)|> and the standard deviation ó are then formed by the image evaluation unit 23 from all Intensity values of the image pixels within this Region of Interest ROI These values <|b(x)|>, ó are then transferred to a arithmetic unit 26 which calculates the quotient of the standard deviation ó for mean <|b(x)|> and then supplies this measured value to an assignment unit 27.

The assignment unit 27 then uses an assignment function 21, which for example is stored in the memory unit 20, to determine the right modulation transfer function MTF for the local frequency í corresponding to the periodicity L of the phantom stripe structure and outputs this to the operator (for example via the console 14).

With a very convenient embodiment this value is initially stored and then after the calibration of a number of phantom stripe structures $S_1$, $S_2$, $S_3$, $S_4$, $S_5$, $S_6$ a complex assignment function is created with the aid of the support points thus obtained using a suitable fit method.

The image evaluation unit 23, the control device 24 and the arithmetic unit 26 and the assignment unit 27 are realized here in the form of software on the processor 22. The image evaluation unit 23 and the control unit 24 can be units which already exist within conventional magnetic resonance devices. The arithmetic unit 26 and the assignment unit 27 are advantageously implemented as submodules within what is known as a service unit 25, which also takes the form of software installed on the processor 22. Such service programs are usually already available for other measurement and test procedures.

Finally it should be pointed out once again that the structures depicted in the Figures merely involve exemplary embodiments and that the Figures only show those parts necessary to the understanding of the invention. It is thus clear that the magnetic resonance device 10 and the control device 13 of the magnetic resonance device 10 according to FIG. 8 also features all the usual further components of such devices or control devices.

Furthermore it is also possible for a person skilled in the art to vary the individual components within the framework of the invention and for example for a number of assignment functions 21 which apply to phantom stripe structures with different fill factors to be stored in the memory device 20—which otherwise does not absolutely have to be within the control device 13, but can also be located on an external network, to which the control device 13 has access. The user can then for example enter via the console 4 which phantom he has used or which fill factor the phantom stripe structures used feature, so that the correct assignment function 21 is selected by the assignment unit 27. Furthermore for example the arrangement of various phantom stripe structures within a phantom can be implemented in another way.

The invention can be used for any magnetic resonance tomography devices both in the medical and also in the scientific and/or industrial area.

The invention claimed is:

1. A device for determining the Modulation Transfer Function (MTF) of a magnetic resonance system, comprising:

an image evaluation unit for determining a mean value and a standard deviation of intensity values of a plurality of image pixels included in a Region of Interest of a cross-sectional image of a stripe structure arranged transversely relative to an image recording plane of a phantom, the stripe structure having a number of alternately arranged magnetic-resonance-active material layers and magnetic-resonance-inactive material layers including an arrangement periodicity, the cross-sectional image recorded by a magnetic resonance system and the stripe structure having a space factor greater than 0.5 in a relevant Region of Interest included in the cross-sectional image;

a computing unit for calculating the quotient of the mean value and the standard deviation;

a memory computing device for determining at least one of a plurality of stripe structures having different space factors for use with the image evaluation unit; and an assignment computing unit for calculating the Modulation Transfer Function (MTF) relative to a local frequency given by the arrangement periodicity of the determined stripe structure and relative to the space factor of the determined stripe structure, wherein the space factor of the determined stripe structure and the quotient of the mean and the standard deviation are used when calculating the Modulation Transfer Function (MTF).

2. A method for determining the Modulation Transfer Function (MTF) of a magnetic resonance system, comprising:

recording a cross-sectional image of a stripe structure of a phantom by the magnetic resonance system, the stripe structure arranged transversely relative to a cross-sectional image recording plane and having a plurality of magnetic-resonance-active layers and magnetic-resonance-inactive layers, the layers arranged alternately including an arrangement periodicity and the magnetic-resonance-active layers being thicker than the magnetic-resonance-inactive layers;

determining the quotient of a mean value and a standard deviation of intensity values of a plurality of image pixels included in a Region of Interest of the cross-sectional image; and determining the Modulation Transfer Function (MTF) using the quotient.

3. The method according to claim 2, wherein the phantom stripe structure has a space factor of at least 0.565.

4. The method according to claim 2, wherein the phantom stripe structure has a space factor of at least 0.603.

5. The method according to claim 2, wherein the Modulation Transfer Function (MTF) is determined depending on a local frequency using a plurality of cross-sectional images recorded of a corresponding plurality of stripe structures, the stripe structures having different arrangement periodicities.

6. The method according to claim 2, wherein the periodicity of the stripe structure is determined according to a resolution of the magnetic resonance system, so that a local frequency has a value within an interval covering the range of half the Nyquist frequency and the Nyquist frequency.

7. A phantom stripe structure for determining the Modulation Transfer Function (MTF) of a magnetic resonance system, comprising a plurality of alternately arranged magnetic-resonance-active layers and magnetic-resonance-inactive layers including an arrangement periodicity, wherein the magnetic-resonance-active layers are thicker than the magnetic-resonance-inactive layers.

8. A phantom for use with a medical MR device, comprising:

a phantom stripe structure having a plurality of alternately arranged magnetic-resonance-active layers and magnetic-resonance-inactive layers including an arrangement periodicity, wherein the magnetic-resonance-active layers are thicker than the magnetic-resonance-inactive layers.

9. The phantom according to claim 8, wherein the phantom comprises a plurality of phantom-stripe structures having different arrangement periodicities.

10. The method according to claim 2, wherein the phantom stripe structure has a space factor of at least 0.517.

11. A magnetic resonance system, comprising a device for determining the Modulation Transfer Function (MTF) of the magnetic resonance system, the device comprising:

an image evaluation unit for determining a mean value and a standard deviation of intensity values of a plurality of image pixels included in a Region of Interest of a cross-sectional image of a stripe structure arranged transversely relative to an image recording plane of a phantom, the stripe structure having a number of alternately arranged magnetic-resonance-active material layers and magnetic-resonance-inactive material layers including an arrangement periodicity, the cross-sectional image recorded by a magnetic resonance system and the stripe structure having a space factor greater than 0.5 in a relevant Region of Interest included in the cross-sectional image;

a computing unit for calculating the quotient of the mean value and the standard deviation;

a memory computing device for determining at least one of a plurality of stripe structures having different space factors for use with the image evaluation unit; and an assignment computing unit for calculating the Modulation Transfer Function (MTF) relative to a local frequency given by the arrangement periodicity of the determined stripe structure and relative to the space factor of the determined stripe structure, wherein the space factor of the determined stripe structure and the quotient of the mean and the standard deviation are used when calculating the Modulation Transfer Function (MTF).

12. The method according to claim 2, wherein a computer program product having software code loadable into a memory of a programmable logic controller of the magnetic resonance system is used for executing all steps of the method.

* * * * *